(12) United States Patent
Otake et al.

(10) Patent No.: US 7,948,031 B2
(45) Date of Patent: May 24, 2011

(54) SEMICONDUCTOR DEVICE AND METHOD OF FABRICATING SEMICONDUCTOR DEVICE

(75) Inventors: Seiji Otake, Kumagaya (JP); Yasuhiro Takeda, Ogaki (JP); Kenichi Maki, Ibaraki (JP)

(73) Assignees: Sanyo Electric Co., Ltd., Osaka (JP); Sanyo Semiconductor Co., Ltd., Gunma (JP)

( * ) Notice: Subject to any disclaimer, the term of this patent is extended or adjusted under 35 U.S.C. 154(b) by 252 days.

(21) Appl. No.: 12/167,764

(22) Filed: Jul. 3, 2008

(65) Prior Publication Data

US 2009/0014790 A1 Jan. 15, 2009

(30) Foreign Application Priority Data

Jul. 3, 2007 (JP) ................................ 2007-175548
Jul. 9, 2007 (JP) ................................ 2007-179693

(51) Int. Cl.
 *H01L 29/66* (2006.01)
(52) U.S. Cl. ................ 257/335; 257/330; 257/E29.257; 257/E21.419; 438/270
(58) Field of Classification Search .................. 438/270, 438/FOR. 424; 257/330, 335, 341, 401, 257/E29.256, E29.257, E21.418, E21.419
See application file for complete search history.

(56) References Cited

U.S. PATENT DOCUMENTS

| 5,525,821 | A  | 6/1996  | Harada et al.   |
| 5,682,048 | A  | 10/1997 | Shinohara et al.|
| 6,323,518 | B1 | 11/2001 | Sakamoto et al. |
| 6,828,626 | B2 | 12/2004 | Oikawa et al.   |
| 6,967,139 | B2 | 11/2005 | Oikawa et al.   |

FOREIGN PATENT DOCUMENTS

| JP | 6-45612 A    |   | 2/1994  |
| JP | 8-316467 A   |   | 11/1996 |
| JP | 2000-91344 A |   | 3/2000  |
| JP | 2000-188397  | * | 7/2000  |
| JP | 2000-188397 A|   | 7/2000  |
| JP | 2000-332243 A|   | 11/2000 |
| JP | 2003-174166 A|   | 6/2003  |
| JP | 2003-303960 A|   | 10/2003 |

OTHER PUBLICATIONS

Chinese Office Action for corresponding CN Application No. 200810129578.1, dated Dec. 11, 2009, pp. 1-7.
Japanese Office Action for corresponding Patent Application No. JP 2007-175548, dated Aug. 18, 2009, pp. 1-8, Japan.

* cited by examiner

*Primary Examiner* — Matthew S Smith
*Assistant Examiner* — Quovaunda Jefferson
(74) *Attorney, Agent, or Firm* — Ditthavong Mori & Steiner, P.C.

(57) ABSTRACT

A semiconductor device includes a gate electrode formed through an insulating film in a groove having a first side surface adjacent to a source region and a base region, and a second conductive type first impurity region formed adjacent to a second side surface of the groove between the groove and a lead-out portion of a drain region existing below the base region so as to extend downward beyond a lower end of the groove.

14 Claims, 11 Drawing Sheets

SEMICONDUCTOR DEVICE AND METHOD OF FABRICATING SEMICONDUCTOR DEVICE

CROSS-REFERENCE TO RELATED APPLICATIONS

The priority application number JP2007-175548, Semiconductor Device, Jul. 3, 2007, Kenichi Maki et al, JP2007-179693, Semiconductor Device and Method of Fabricating Semiconductor Device, Jul. 9, 2007, Kenichi Maki et al, upon which this patent application is based is hereby incorporated by reference.

BACKGROUND OF THE INVENTION

1. Field of the Invention

The present invention relates to a semiconductor device and a method of fabricating the semiconductor device, and more particularly, it relates to a semiconductor device formed with a gate electrode in a groove and a method of fabricating the semiconductor device.

2. Description of the Background Art

A semiconductor device formed with a gate electrode in a groove is known in general. A conventional semiconductor device includes an $n^-$-type drain drift region (second drain region) on an $n^+$-type buried region (first drain region). This drain drift region is formed with a plurality of grooves and the grooves are formed with gate electrodes through insulating films. A p-type base region is formed between the plurality of grooves of the conventional semiconductor device, and an $n^+$-type source region is formed on the base region. The drain drift region of the conventional semiconductor device is formed with drain lead-out regions laterally of the plurality of grooves. Since a reverse bias voltage is applied to a p-n junction portion between the drain drift region and the base region when a voltage is applied to source/drain regions, the conventional semiconductor device is constituted such that a depletion layer is formed on the p-n junction portion. Thus, an electric field formed below the source region is relaxed by the depletion layer of the p-n junction portion.

In the aforementioned conventional semiconductor device, however, electric field concentration disadvantageously occurs in the vicinity of outer corner portions of lower ends of the outermost grooves when a voltage is applied to the source/drain regions, since no base region is formed outside of the outermost grooves (on sides closer to the drain lead-out regions) among the plurality of grooves formed with the gate electrodes. Therefore, the breakdown voltage of the semiconductor device is disadvantageously reduced due to the electric field concentration.

SUMMARY OF THE INVENTION

A semiconductor device according to a first aspect of the present invention comprises a first conductive type first drain region, a first conductive type second drain region formed on the first drain region and having an impurity concentration lower than an impurity concentration of the first drain region, a lead-out portion of the first drain region formed so as to reach the first drain region through the second drain region, a second conductive type base region formed on the second drain region, a first conductive type source region formed on the base region, a gate electrode formed through an insulating film in a groove having a first side surface adjacent to the source region and the base region, and a second conductive type first impurity region formed adjacent to a second side surface of the groove between the groove and the lead-out portion so as to extend downward beyond a lower end of the groove.

A semiconductor device according to a second aspect of the present invention comprises a first conductive type first drain region, a first conductive type second drain region formed on the first drain region and having an impurity concentration lower than an impurity concentration of the first drain region, a lead-out portion of the first drain region formed so as to reach the first drain region through the second drain region, a gate electrode formed in a groove formed on the second drain region and a second conductive type impurity region for current path control formed adjacent to the lead-out portion downward beyond at least a lower end of the groove.

A method of fabricating a semiconductor device according to a third aspect of the present invention comprises steps of forming a first conductive type first drain region, forming a first conductive type second drain region having an impurity concentration lower than an impurity concentration of the first drain region on the first drain region, forming a lead-out portion of the first drain region so as to reach the first drain region through the second drain region, forming a groove on the second drain region, forming a gate electrode in the groove and forming a second conductive type impurity region for current path control adjacent to the lead-out portion downward beyond at least a lower end of the groove by ion-implanting an impurity.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will be hereinafter described with reference to the drawings.

First Embodiment

Figure 1:
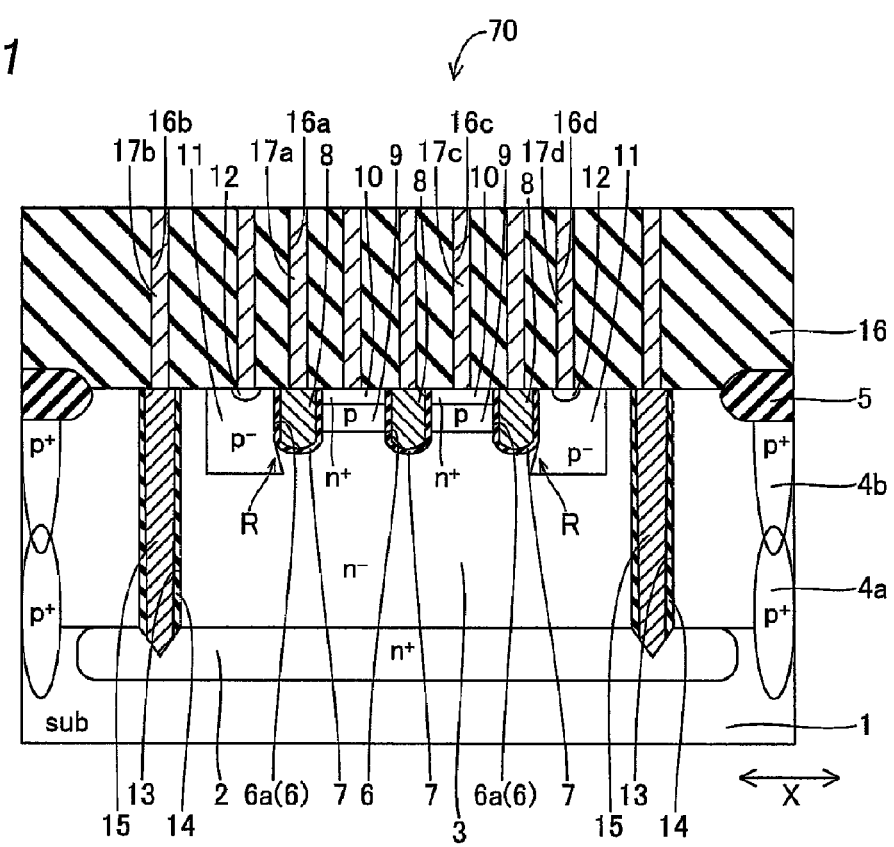
FIG. 1 is a sectional view showing a structure of a trench gate type power MOSFET according to a first embodiment of the present invention.

In a power MOSFET 70 according to a first embodiment, an n$^+$-type drain region 2 is formed on a surface of a silicon substrate 1, as shown in FIG. 1. An n$^-$-type drain drift region 3 made of an epitaxial layer is formed on a surface of the silicon substrate 1. The power MOSFET 70 is an example of the "semiconductor device" in the present invention. The drain region 2 is an example of the "first drain region" in the present invention, and the drain drift region 3 is an example of the "second drain region" in the present invention.

The silicon substrate 1 and the drain drift region 3 are formed with a p-type isolation region 4a so as to surround the drain region 2. The drain drift region 3 is formed with a p-type isolation region 4b above a region corresponding to the element isolation region 4a. An element isolation portion 5 made of SiO$_2$ is formed on a surface of the drain drift region 3 above a region corresponding to an element isolation region 4b.

Figure 2:
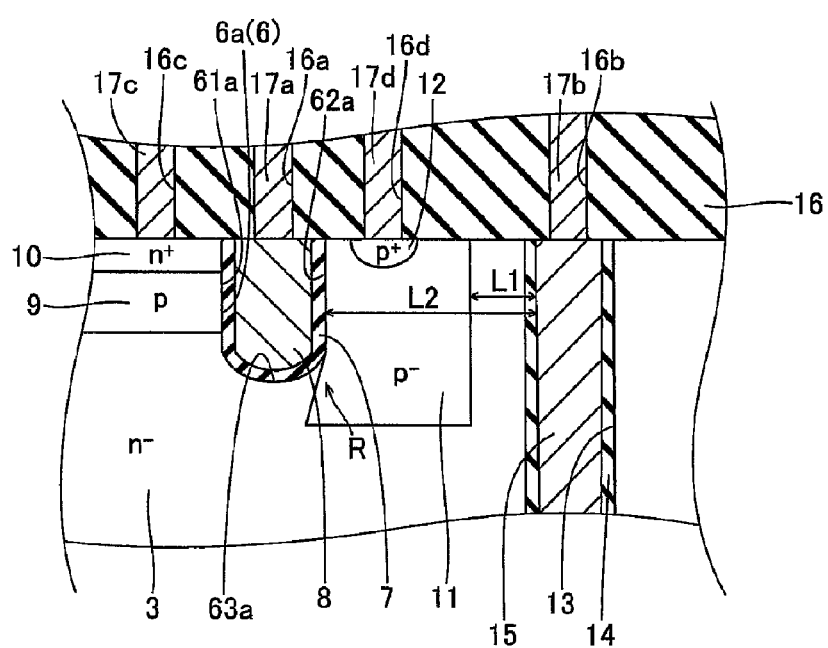
FIG. 2 is an enlarged sectional view showing the vicinity of an impurity region of the power MOSFET according to the first embodiment shown in FIG. 1.

A plurality of (three in the first embodiment) grooves 6 are so formed on the surface of the drain drift region 3 as to extend in a direction Y (see FIG. 3) at prescribed intervals in a direction X. Gate electrodes 8 made of polysilicon are formed through gate insulating films 7 made of SiO$_2$ in the grooves 6. P-type base regions 9 are formed between the plurality of grooves 6 and n$^+$-type source regions 10 are formed on overall surfaces of the base regions 9. Therefore, the base regions 9 and the source regions 10 are provided on regions adjacent to first side surfaces 61a of outermost grooves 6a among the plurality of grooves 6, as shown in FIG. 2. On the other hand, a p$^-$-type impurity region 11 is formed on regions adjacent to second side surfaces 62a of the grooves 6a. The source regions 10 may not be formed on the overall surfaces of the base regions 9 so far as the source regions 10 are formed adjacent to the grooves 6 on the base regions 9.

Figure 3:
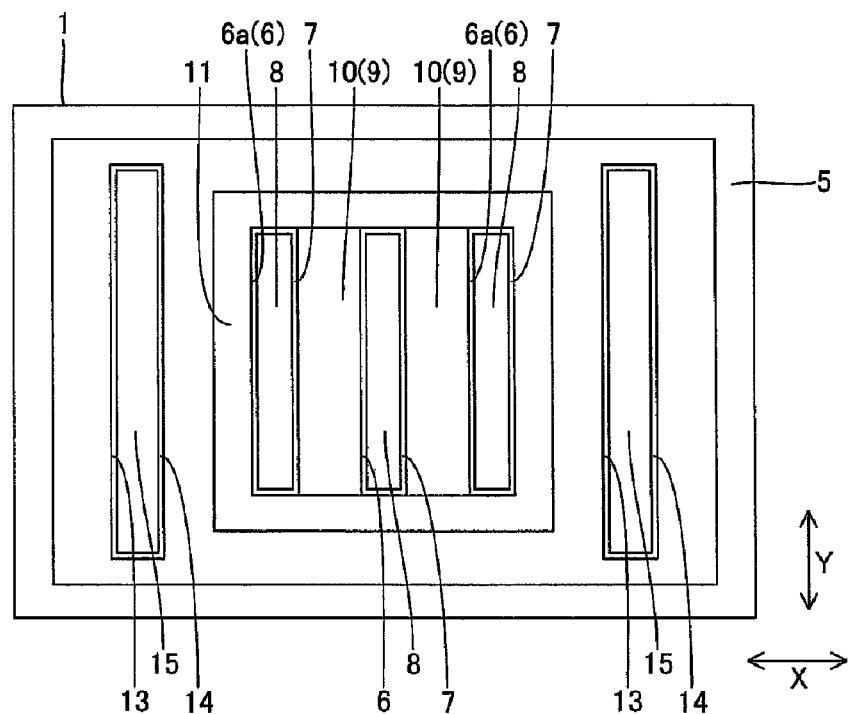
FIG. 3 is a plan view schematically showing the power MOSFET according to the first embodiment shown in FIG. 1.

The impurity region 11 is so formed as to extend downward beyond lower ends 63a of the grooves 6a and project toward the grooves 6a below the grooves 6a. The impurity region 11 has an impurity concentration (p$^-$) lower than the impurity concentrations (p) of the base regions 9. In other words, the impurity region 11 has a resistance higher than that of the base regions 9. As shown in FIG. 3, the impurity region 11 is formed in a rectangular annular shape in plan view and provided so as to surround the gate electrodes 8, the base regions 9 and the source regions 10. The impurity region 11 is an example of the "first impurity region" in the present invention.

P$^+$-type impurity regions 12 are formed on a surface of the impurity region 11, as shown in FIG. 2. The impurity regions 12 are provided for connecting the impurity region 11 and plugs 17d described layer. The impurity regions 12 each have an impurity concentration (p$^+$) higher than the impurity concentration (p$^-$) of the impurity region 11. The impurity regions 12 are each an example of the "second impurity region" in the present invention.

As shown in FIG. 1, grooves 13 reaching the drain region 2 through the drain drift region 3 are formed between the impurity region 11 and the element isolation portion 5 in the direction X. As shown in FIG. 3, the grooves 13 are provided outside the annular impurity region 11. As shown in FIG. 1, insulating films 14 made of SiO$_2$ are formed on side surfaces of the grooves 13. Drawing portions 15 of the drain region 2, made of tungsten for example, are formed in the grooves 13. Each of the lead-out portions 15 is provided at an interval L1 (see FIG. 2) from the impurity region 11. The interval L1 is an example of the "prescribed interval" in the present invention.

An interlayer dielectric film 16 made of SiO$_2$ is formed on the surface of the drain drift region 3. Contact holes 16a to 16d are formed in the interlayer dielectric film 16 and plugs 17a to 17d are formed in the contact holes 16a to 16d respectively. The plugs 17a are connected to the gate electrodes 8 and the plugs 17b are connected to the lead-out portions 15. The plugs 17c are connected to the source regions 10 and the plugs 17d are connected to the impurity regions 12.

The power MOSFET 70 is so formed as to apply a positive voltage to the drain region 2 through the plugs 17b and the lead-out portions 15. The power MOSFET 70 is so formed as to apply a ground voltage to the source regions 10 through the plugs 17c and apply the ground voltage to the impurity region 11 through the plugs 17d and the impurity regions 12. The power MOSFET 70 is so formed as to be tuned on by forming a channel in the base regions 9 along the side surfaces of the grooves 6 when a voltage exceeding a threshold voltage to the gate electrodes 8 through the plugs 17a. The power MOSFET 70 is so formed that depletion layers are formed on p-n junction portions between the drain drift region 3 and the base regions 9 on sides of the first side surfaces 61a of the grooves 6a when a voltage is applied to the source/drain regions.

According to the first embodiment, as hereinabove described, the impurity region 11 is formed on the regions adjacent to the second side surfaces 62a of the outermost grooves 6a, whereby a depletion layer is formed on a p-n junction portion between the drain drift region 3 and the impurity region 11 also on sides of the second side surfaces 62a (outer sides) of the grooves 6a when the voltage is applied between the source/drain regions, and hence this depletion layer can suppress electric field concentration on regions R (see FIG. 2) which are located in the vicinity of outer corner portions of the lower ends 63a of the grooves 6a. The impurity region 11 is so formed as to extend below the lower ends 63a of the grooves 6a, whereby the electric field concentration on the regions R can be further suppressed. Additionally, the impurity region 11 is so formed as to project toward the grooves 6a below the grooves 6a, whereby the electric field concentration on the regions R can be also further suppressed. Thus, reduction in the breakdown voltage of the power MOSFET 70 can be suppressed.

According to the first embodiment, the impurity region 11 is formed, whereby the electric field concentration on the regions R can be suppressed and hence a current path can be inhibited from being attracted to the lead-out portions 15 when distances L2 (see FIG. 2) between the grooves 6a and the lead-out portions 15 is reduced. Thus, the area of the power MOSFET 70 can be reduced while suppressing reduction in the breakdown voltage of the power MOSFET 70. In a case where the lead-out portions 15 are formed, the electric field concentration on the regions R is strong as compared with a case where the lead-out portions 15 are not formed, and hence the breakdown voltage of the power MOSFET 70 is reduced. In this case, the impurity region 11 is formed, whereby the electric field concentration on the regions R can be suppressed and hence it is possible to form the power MOSFET 70 capable of suppressing reduction in the breakdown voltage and the area while having the lead-out portions 15.

According to the first embodiment, the impurity region 11 has the impurity concentration ($p^-$) lower than the impurity concentration (p) of the base regions 9, whereby the impurity region 11 has a resistance higher than that of the base regions 9 and hence the impurity region 11 can be inhibited from becoming a current path.

Figure 7:
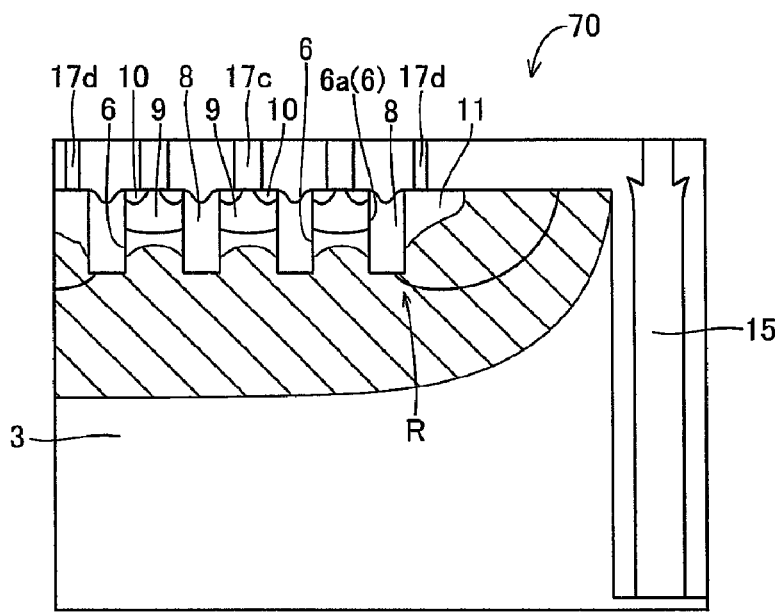
FIG. 7 is a potential distribution diagram of the power MOSFET according to the first embodiment obtained by a simulation.
Figure 8:
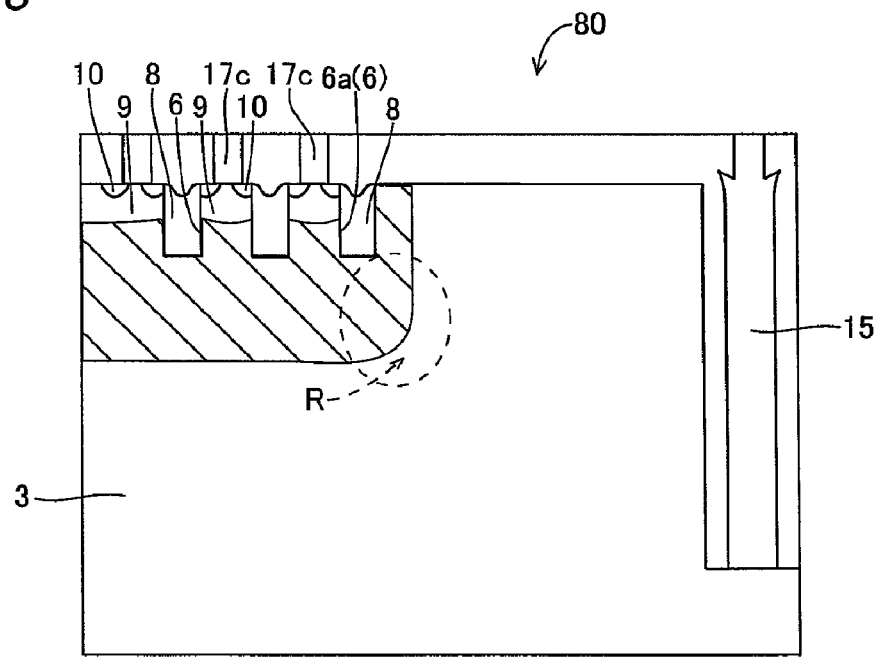
FIG. 8 is a potential distribution diagram of a power MOSFET according to a comparative example obtained by a simulation.

A simulation performed for confirming the effects of the impurity region 11 according to the aforementioned first embodiment will be now described. In the simulation, potential distribution in applying a voltage between the source/drain regions of the power MOSFET 70 formed with the impurity region 11, according to the first embodiment was calculated and potential distribution in applying a voltage between source/drain regions of a power MOSFET 80 formed with no impurity region 11, according to a comparative example was calculated. FIGS. 7 and 8 show results thereof. Regions where an electric field is strong (change in a potential is large) are shown by hatching (slant lines) in FIGS. 7 and 8.

In the power MOSFET 70 according to the first embodiment, it has been proved from the result of the simulation shown in FIG. 7 that the region where the electric field is strong is so formed as to disperse in the vicinity of the lower ends of the grooves 6 and in the vicinity of interface between the drain drift region 3 and the impurity region 11. This is conceivably because the electric field by a voltage applied between the source/drain regions is relaxed by the depletion layer formed on the p-n junction portion between the impurity region 11 and the drain drift region 3 and hence the electric field concentration does not occur on the regions R.

On the other hand, it has been proved from the result of the simulation shown in FIG. 8 that the electric field is steeply bent from the regions R in the power MOSFET 80 according to the comparative example. This is conceivably because the electric field concentration occurs on the regions R since the impurity region 11 is not formed.

Figure 4:
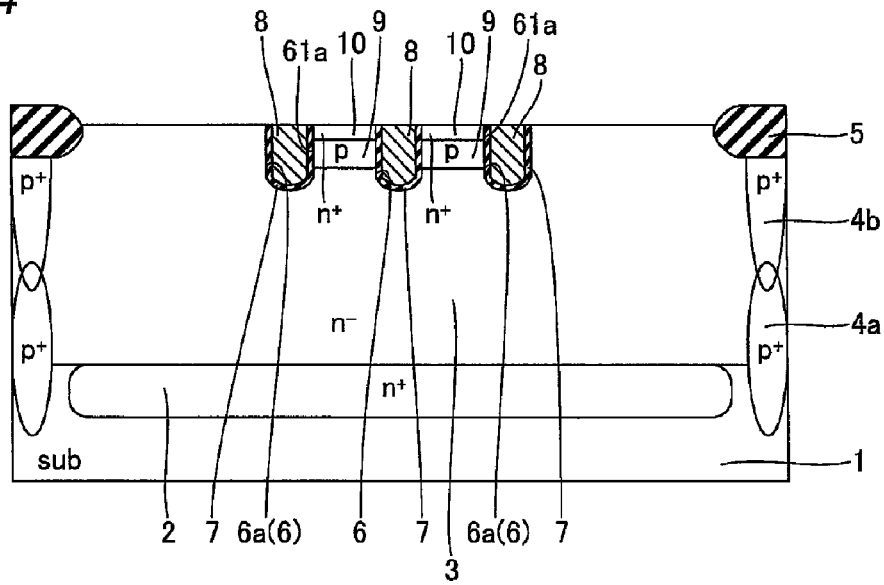
FIGS. 4 to 6 are sectional views for illustrating a fabricating process of the power MOSFET according to the first embodiment of the present invention.

In a fabricating process for the power MOSFET 70 according to the first embodiment of the present invention, the drain region 2, the drain drift region 3, the element isolation regions 4a and 4b and the element isolation portion 5 made of $SiO_2$ are formed, as shown in FIG. 4. Prescribed regions on the surface of the drain drift region 3 are patterned by photolithography and etching. Thus, the grooves 6 are formed. Thereafter the gate insulating films 7 made of $SiO_2$ are formed by thermal oxidation. Then the gate electrodes 8 are formed in the grooves 6. More specifically, polysilicon layers are so stacked as to be embedded in the grooves 6. The polysilicon layers are doped with an impurity and thereafter are etched back.

The base regions 9 and the source regions 10 are formed on the regions between the grooves 6. More specifically, resist masks with prescribed pattern are provided by photolithography. The p-type impurity is ion-implanted so that the base regions 9 are formed, and the n-type impurity is ion-implanted so that the source regions 10 are formed. Thereafter the resist masks are removed. Thus, the base regions 9 and the source regions 10 are formed on regions adjacent to the first side surfaces 61a of the outermost grooves 6a among the plurality of grooves 6.

Figure 5:
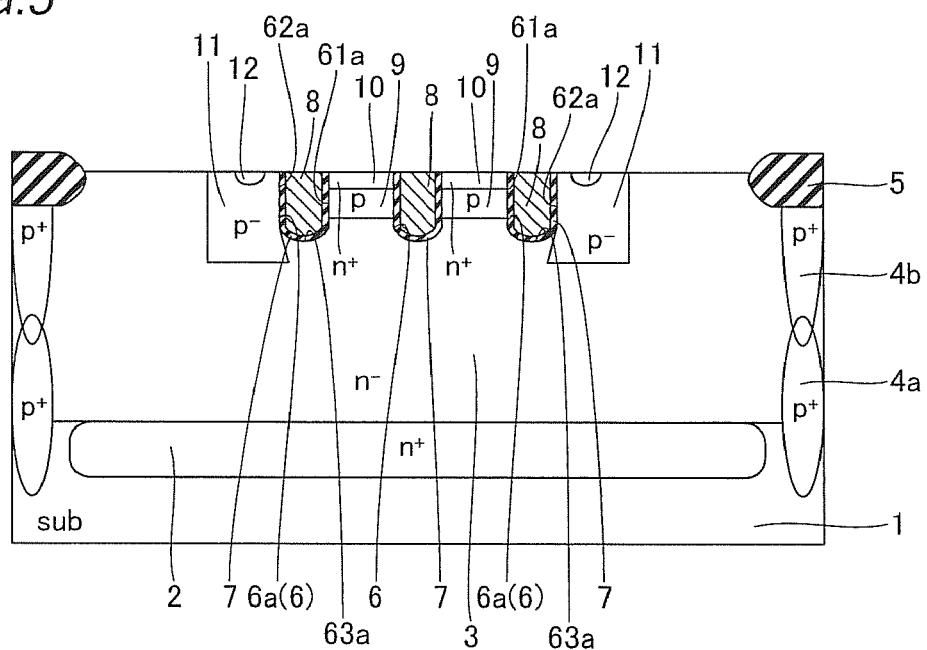

As shown in FIG. 5, the impurity region 11 is formed on the regions adjacent to the second side surfaces 62a of the grooves 6a. More specifically, a prescribed patterned resist mask is provided by photolithography. Then the p-type impurity is ion-implanted, thereby forming the impurity region 11 so as to have the rectangular annular shape in plan view. Thereafter the resist mask is removed. The impurity region 11 is so formed as to extend below the lower ends 63a of the grooves 6a and have the impurity concentration ($p^-$) lower than the impurity concentration (p) of the base regions 9. The impurity region 11 is so formed as to project toward the grooves 6a below the grooves 6a.

The impurity regions 12 are formed on the surface of the impurity region 11. More specifically, a prescribed patterned resist mask is provided by photolithography. Then the p-type impurity is ion-implanted, thereby forming the impurity regions 12. Thereafter the resist mask is removed. The impurity regions 12 are so formed as to have the impurity concentration ($p^+$) higher than the impurity concentration ($p^-$) of the impurity region 11.

Thereafter thermal treatment is performed by RTA (rapid thermal annealing), thereby recovering the base regions 9, the source regions 10 and the impurity regions 11 and 12 from crystal defects resulting from the ion implantation and activating the impurities implanted for forming the base regions 9, the source regions 10 and the impurity regions 11 and 12.

Figure 6:
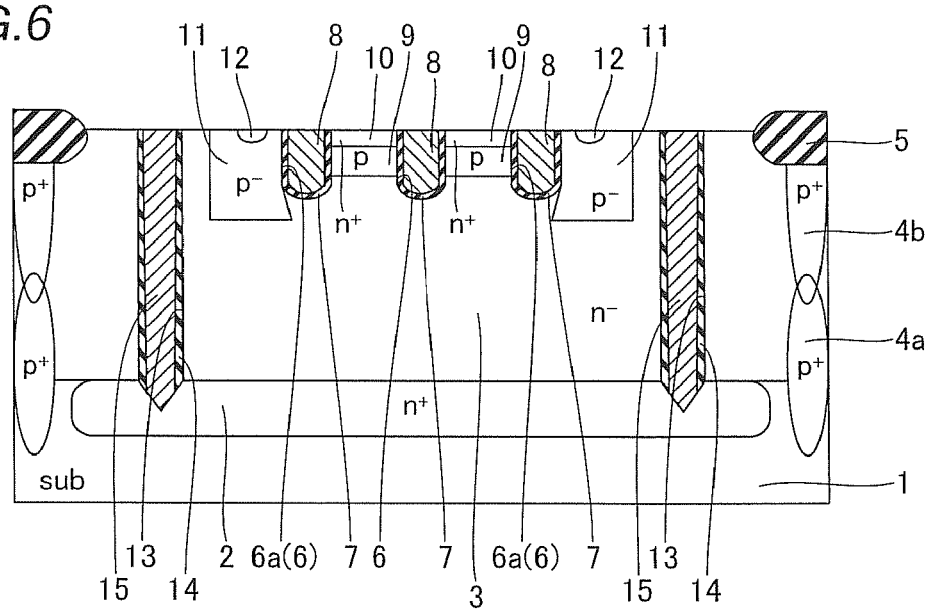

As shown in FIG. 6, the prescribed regions on the surface of the drain drift region 3 are patterned by photolithography and etching. Thus, the grooves 13 are formed between the impurity region 11 and the element isolation portion 5. The insulating films 14 made of $SiO_2$ are formed on the side surfaces of the grooves 13. More specifically, $SiO_2$ layers are formed by CVD (chemical vapor deposition) and thereafter the $SiO_2$ layers formed on the bottom surfaces of the grooves 13 are removed by etching. Then the lead-out portions 15 are formed in the grooves 13. More specifically, conductive layers made of tungsten for example are embedded in the grooves 13 and etched back.

As shown in FIG. 1, the interlayer dielectric film 16 made of $SiO_2$ is formed by CVD. After forming the contact holes 16a to 16d on the interlayer dielectric film 16, the plugs 17a to 17d are formed on the contact holes 16a to 16d. The power MOSFET 70 according to the first embodiment is formed in the aforementioned manner.

Second Embodiment

Figure 9:
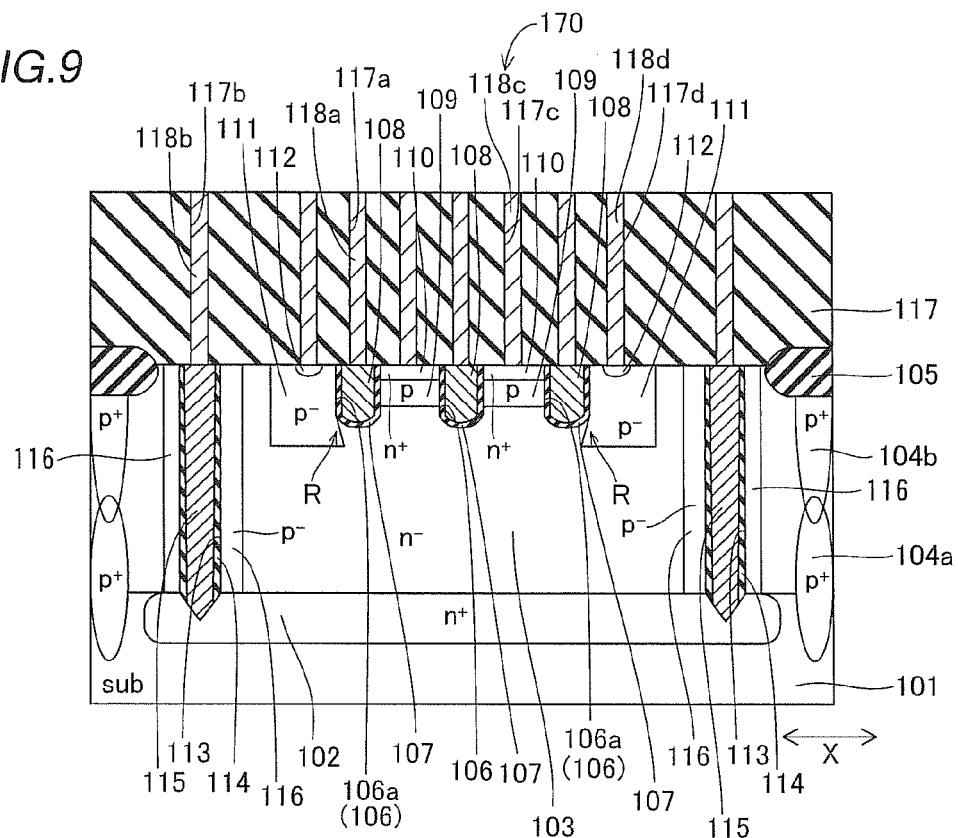
FIG. 9 is a sectional view showing a structure of a trench gate type power MOSFET according to a second embodiment of the present invention.

As shown in FIG. 9, impurity regions 116 are formed on regions adjacent to lead-out portions 115 in a power MOSFET 170 according to a second embodiment, dissimilarly to the aforementioned first embodiment.

In the power MOSFET 170, an $n^+$-type drain region 102 is formed on a surface of a silicon substrate 101, as shown in FIG. 9. An $n^-$-type drain drift region 103 made of an epitaxial layer is formed on a surface of the silicon substrate 101. The drain region 102 is an example of the "first drain region" in the present invention, and the drain drift region 103 is an example of the "second drain region" in the present invention.

The silicon substrate 101 and the drain drift region 103 are formed with a p-type isolation region 104a so as to surround the drain region 102. The drain drift region 103 is formed with a p-type isolation region 104b above a region corresponding to the element isolation region 104a. An element isolation portion 105 made of $SiO_2$ is formed on a surface of the drain drift region 103 above a region corresponding to an element isolation region 104b.

Figure 10:
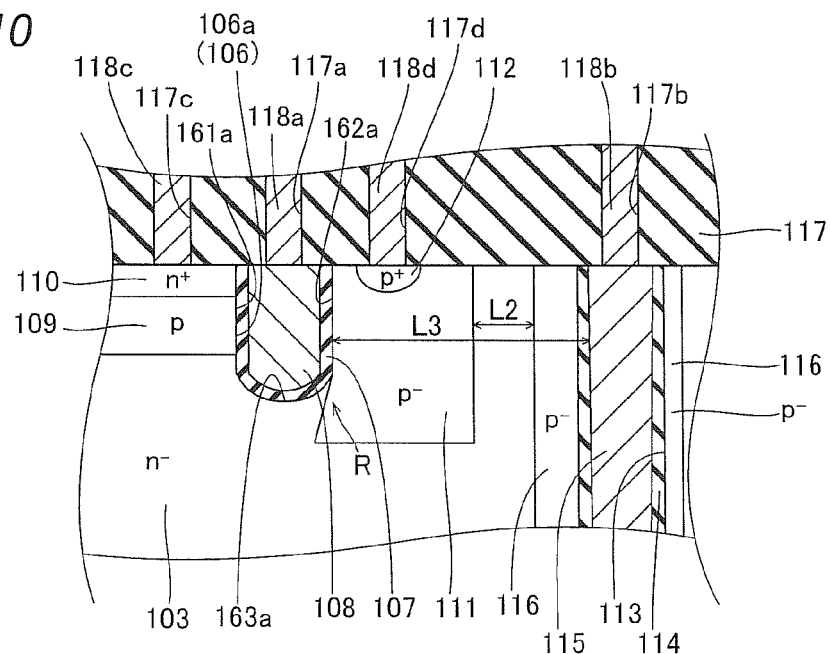
FIG. 10 is an enlarged sectional view showing the vicinity of an impurity region of the power MOSFET according to the second embodiment shown in FIG. 9.

A plurality of (three in the second embodiment) grooves 106 are so formed on the surface of the drain drift region 103 as to extend in a direction Y (see FIG. 11) at prescribed intervals in a direction X. Gate electrodes 108 made of polysilicon are formed through gate insulating films 107 made of $SiO_2$ in the grooves 106. P-type base regions 109 are formed between the plurality of grooves 106 and $n^+$-type source regions 110 are formed on overall surfaces of the base regions 109. Therefore, the base regions 109 and the source regions 110 are provided on regions adjacent to first side surfaces 161a of outermost grooves 106a among the plurality of grooves 106, as shown in FIG. 10. On the other hand, a $p^-$-type impurity region 111 is formed on regions adjacent to second side surfaces 162a of the grooves 106a.

Figure 11:
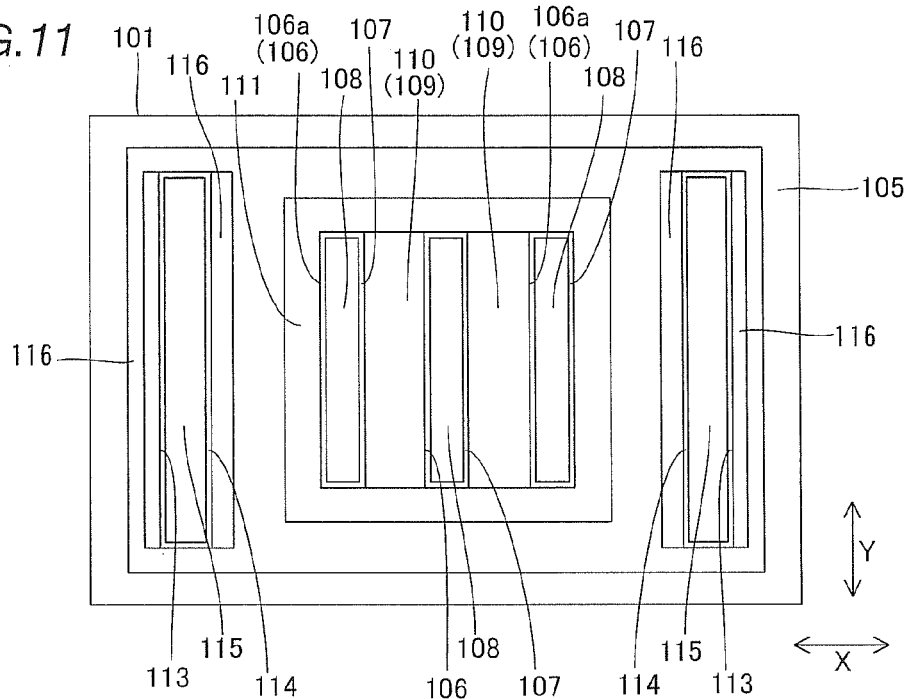
FIG. 11 is a plan view schematically showing the power MOSFET according to the second embodiment shown in FIG. 9.

The impurity region 111 is so formed as to extend downward beyond lower ends 163a of the grooves 106a and project toward the grooves 106a below the grooves 106a. The impurity region 111 has an impurity concentration ($p^-$) lower than the impurity concentrations (p) of the base regions 109. In other words, the impurity region 111 has a resistance higher than that of the base regions 109. As shown in FIG. 11, the impurity region 111 is formed in a rectangular annular shape in plan view and provided so as to surround the gate electrodes 108, the base regions 109 and the source regions 110. The impurity region 111 is an example of the "first impurity region" in the present invention.

$P^+$-type impurity regions 112 are formed on a surface of the impurity region 111, as shown in FIG. 10. The impurity regions 112 are provided for connecting the impurity region 111 and plugs 118d described layer. The impurity regions 112 each have an impurity concentration ($p^+$) higher than the impurity concentration ($p^-$) of the impurity region 111. The impurity regions 112 are each an example of the "second impurity region" in the present invention.

As shown in FIG. 9, grooves 113 reaching the drain region 102 through the drain drift region 103 are formed between the impurity region 111 and the element isolation portion 105 in the direction X. As shown in FIG. 11, the grooves 113 are provided outside the annular impurity region 111. As shown in FIG. 9, insulating films 114 made of $SiO_2$ are formed on side surfaces of the grooves 113. The lead-out portions 115 of the drain region 102, made of a metal layer such as tungsten for example, are formed in the grooves 113.

According to the second embodiment, the $p^-$-type impurity regions 116 are formed on the regions adjacent to the grooves 113. The impurity regions 116 are so formed as to reach the drain region 102 from the surface of the drain drift region 103 and are arranged at intervals L2 (see FIG. 10) from the impurity region 111. The impurity regions 116 may be formed adjacent to the impurity region 111. The impurity regions 116 each have an impurity concentration ($p^-$) lower than the impurity concentration (p) of the base regions 109. In other words, the impurity regions 116 each have a resistance higher than that of the base regions 109. The impurity regions 116 are each an example of the "impurity region for current path control" in the present invention.

An interlayer dielectric film 117 made of $SiO_2$ is formed on the surface of the drain drift region 103. Contact holes 117a to 117d are formed in the interlayer dielectric film 117 and plugs 118a to 118d are formed in the contact holes 117a to 117d respectively. The plugs 118a are connected to the gate electrodes 108 and the plugs 118b are connected to the lead-out portions 115. The plugs 118c are connected to the source regions 110 and the plugs 118d are connected to the impurity regions 112.

The power MOSFET 170 is so formed as to apply a positive voltage to the drain region 102 through the plugs 118b and the lead-out portions 115. The power MOSFET 170 is so formed as to apply a ground voltage to the source regions 110 through the plugs 118c and apply the ground voltage to the impurity region 111 through the plugs 118d and the impurity regions 112. The power MOSFET 170 is so formed as to be tuned on by forming a channel in the base regions 109 along the side surfaces of the grooves 106 when a voltage exceeding a threshold voltage to the gate electrodes 108 through the plugs 118a. The power MOSFET 170 is so formed that depletion layers are formed on p-n junction portions between the drain drift region 103 and the base regions 109 on sides of the first side surfaces 161a of the grooves 106a when a voltage is applied to the source/drain regions.

According to the second embodiment, as hereinabove described, the impurity regions 116 are formed adjacent to the grooves 113, whereby a current path can be inhibited from being attracted to the lead-out portions 115. Thus, reduction in the breakdown voltage of the power MOSFET 170 can be reduced also when distances L3 (see FIG. 10) between the grooves 106a formed with the gate electrodes 108 and the lead-out portions 115 are reduced in order to reduce the area of the power MOSFET 170.

According to the second embodiment, the impurity regions 116 are so formed as to each have the impurity concentration ($p^-$) lower than the impurity concentration (p) of the base regions 109, whereby reduction in the resistance of the impurity regions 116 can be suppressed and hence the impurity regions 116 can be inhibited from becoming a current path.

According to the second embodiment, the impurity regions 116 are so formed as to reach the drain region 102 from the surface of the drain drift region 103, whereby the current path can be reliably inhibited from being attracted to the lead-out portions 115.

According to the second embodiment, the impurity region 111 is formed on the regions adjacent to the second side surfaces 162a of the outermost grooves 106a, whereby a depletion layer is formed on a p-n junction portion between the drain drift region 103 and the impurity region 111 also on sides of the second side surfaces 162a (outer sides) of the grooves 106a when the voltage is applied between the source/drain regions, and hence this depletion layer can suppress electric field concentration on regions R (see FIG. 10) which are located in the vicinity of outer corner portions of the lower ends 163a of the grooves 106a. The impurity region 111 is so formed as to extend below the lower ends 163a of the grooves 106a, whereby the electric field concentration on the regions R can be further suppressed. Additionally, the electric field concentration on the regions R can be further suppressed also by forming the impurity region 111 so as to project toward the grooves 106a below the grooves 106a. Thus, reduction in the breakdown voltage of the power MOSFET 170 can be suppressed.

According to the second embodiment, the impurity region 111 has the impurity concentration ($p^-$) lower than the impurity concentration (p) of the base regions 109, whereby the impurity region 111 has a resistance higher than that of the base regions 109 and hence the impurity region 111 can be inhibited from becoming a current path.

The remaining effects of the second embodiment are similar to those of the aforementioned first embodiment.

Figure 12:
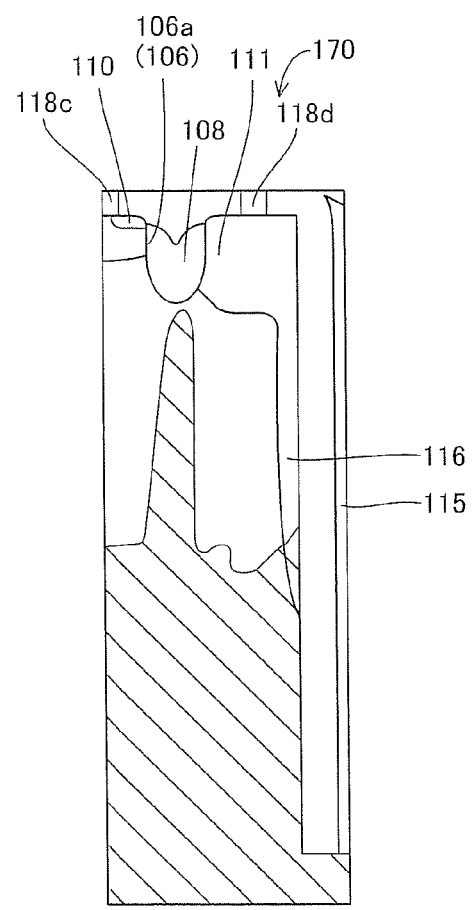
FIG. 12 is a current path diagram of the power MOSFET according to the second embodiment obtained by a simulation.
Figure 13:
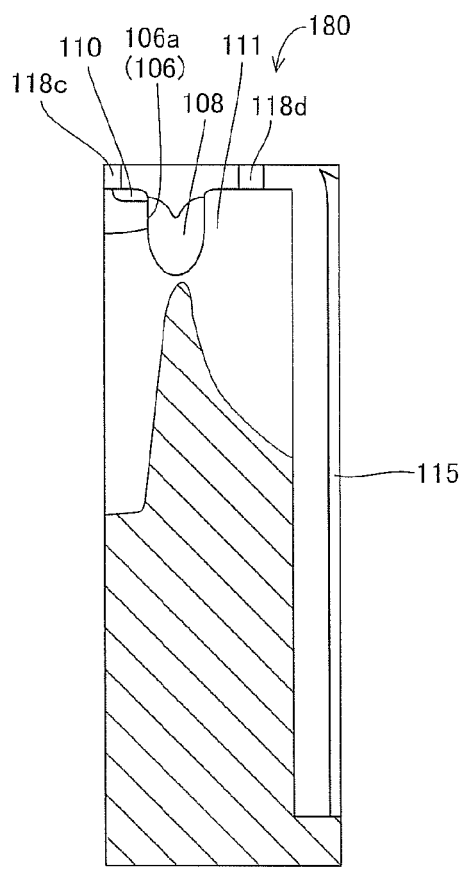
FIG. 13 is a current path diagram of the power MOSFET according to a comparative example obtained by a simulation.

A simulation performed for confirming the effects of the impurity regions 116 according to the aforementioned second embodiment will be now described with reference to FIGS. 12 and 13. FIG. 12 shows the results of the simulation of a current path in applying a voltage between the source/drain regions of the power MOSFET 170 formed with the impurity regions 116, according to the second embodiment. FIG. 13 shows the results of the simulation of a current path in applying a voltage between source/drain regions of a power MOSFET 180 formed with no impurity regions 116. FIG. 13 shows as a comparative example of FIG. 12. The current paths are shown by hatching (slant lines) in FIGS. 12 and 13.

It has been proved from the result of the simulation shown in FIG. 12 that the current path is substantially vertically formed in the power MOSFET 170 according to the second embodiment. This is conceivably because the current path is attracted to the lead-out portions 115 due to the impurity regions 116.

It has been proved from the result of the simulation shown in FIG. 13 that the current path is attracted from the vicinity of lower ends of the outermost gate electrodes 108 toward the lead-out portions 115 in the power MOSFET 180. This is because the impurity regions 116 are not formed.

Figure 14:
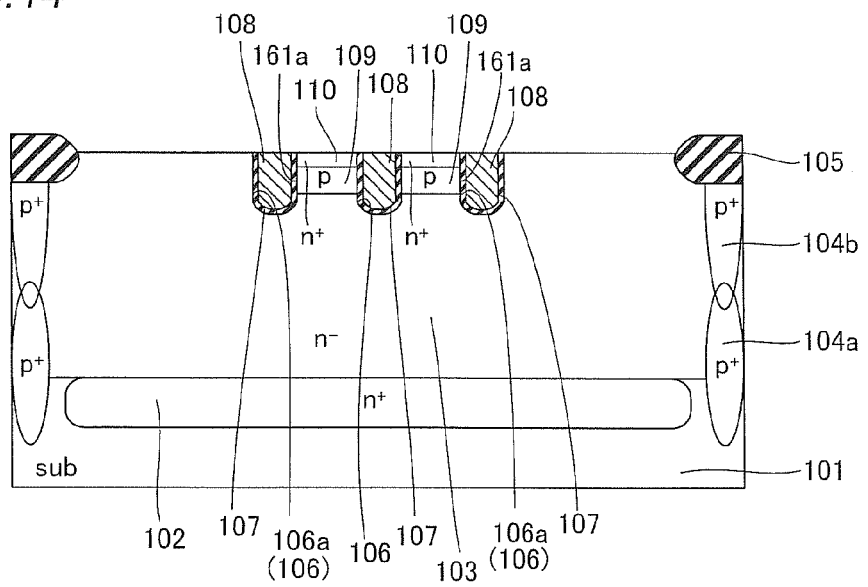
FIGS. 14 to 16 are sectional views for illustrating a fabricating process for the power MOSFET according to the second embodiment of the present invention.

In a fabricating process for the power MOSFET 170 according to the second embodiment of the present invention, the drain region 102, the drain drift region 103, the element isolation regions 104a and 104b and the element isolation portion 105 made of $SiO_2$ are formed, as shown in FIG. 14. Prescribed regions on the surface of the drain drift region 103 are patterned by photolithography and etching. Thus, the grooves 106 are formed. Thereafter the gate insulating films 107 made of $SiO_2$ are formed by thermal oxidation. Then the gate electrodes 108 are formed in the grooves 106. More specifically, polysilicon layers are so stacked as to be embedded in the grooves 106. The polysilicon layers are doped with an impurity and thereafter etched back.

The base regions 109 and the source regions 110 are formed on the regions between the grooves 106. More specifically, resist masks with prescribed pattern are provided by photolithography. The p-type impurity is ion-implanted so that the base regions 109 are formed, and the n-type impurity is ion-implanted so that the source regions 110 are formed. Thereafter the resist masks are removed.

Figure 15:
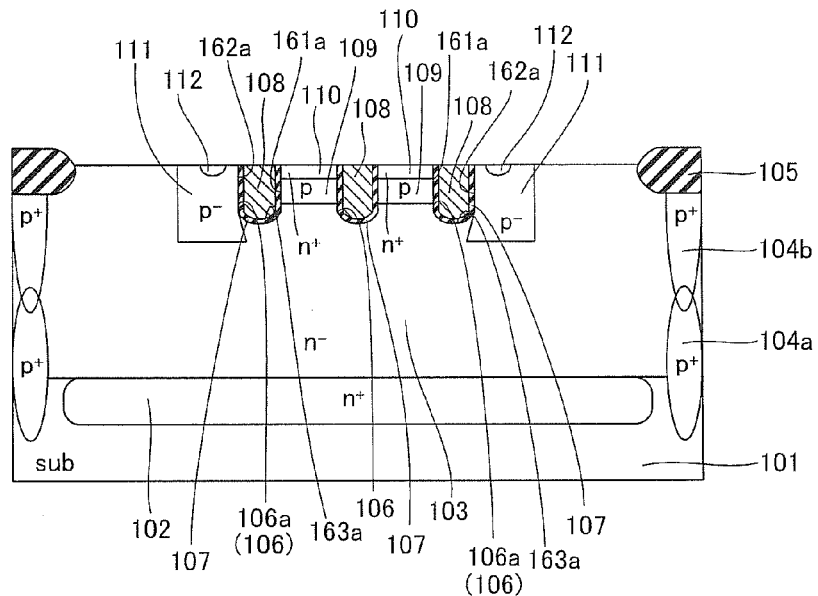

As shown in FIG. 15, the impurity region 111 is formed on the regions adjacent to the second side surfaces 162a of the grooves 106a. More specifically, a prescribed patterned resist mask is provided by photolithography. Then the p-type impurity is ion-implanted, thereby forming the impurity region 111 so as to have the rectangular annular shape in plan view. Thereafter the resist mask is removed. The impurity region 111 is so formed as to extend below the lower ends 163a of the grooves 106a and have the impurity concentration ($p^-$) lower than the impurity concentration (p) of the base regions 109. The impurity region 111 is so formed as to project toward the grooves 106a below the grooves 106a.

The impurity regions 112 are formed on the surface of the impurity region 111. More specifically, a prescribed patterned resist mask is provided by photolithography. Then the p-type impurity is ion-implanted, thereby forming the impurity regions 112. Thereafter the resist mask is removed. The impurity regions 112 are so formed as to have the impurity concentration ($p^+$) higher than the impurity concentration ($p^-$) of the impurity region 111.

Thereafter thermal treatment is performed, thereby recovering the base regions 109, the source regions 110 and the impurity regions 111 and 112 from crystal defects resulting from the ion implantation and activating the impurities implanted for forming the base regions 109, the source regions 110 and the impurity regions 111 and 112.

Figure 16:
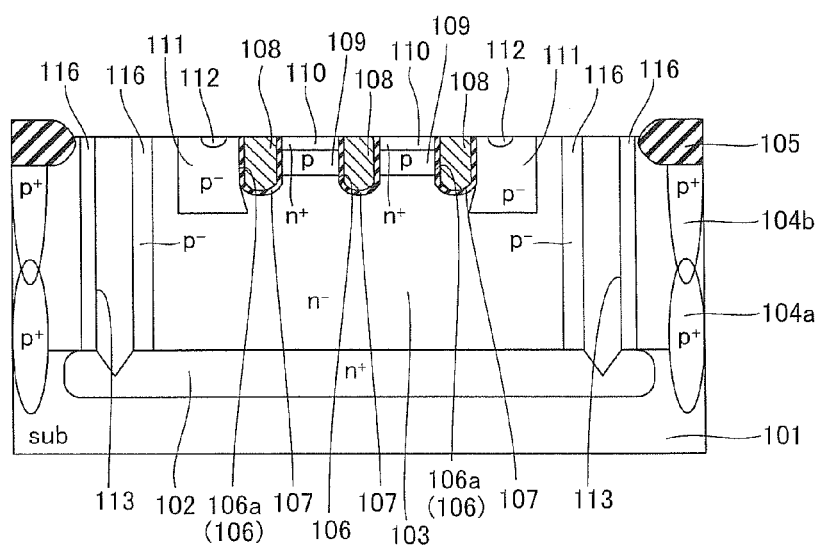

As shown in FIG. 16, the prescribed regions on the surface of the drain drift region 103 are patterned by photolithography and etching. Thus, the grooves 113 are formed between the impurity region 111 and the element isolation portion 105. Then the impurity regions 116 are formed on the regions adjacent to the grooves 113. More specifically, resist masks with prescribed pattern are provided by photolithography. The p-type impurity is ion-implanted so that the impurity regions 116 are formed. Thereafter the resist masks are removed. The impurity regions 116 are so formed as to each have the impurity concentration ($p^-$) lower than the impurity concentration (p) of the base regions 109 and are so formed as to reach the drain region 102 from the surface of the drain drift region 103.

As shown in FIG. 9, the insulating films 114 made of $SiO_2$ are formed on the side surfaces of the grooves 113. More specifically, $SiO_2$ layers are formed by CVD (chemical vapor deposition) and thereafter the $SiO_2$ layers formed on the bottom surfaces of the grooves 113 are removed by etching. Then the lead-out portions 115 are formed in the grooves 113. More specifically, conductive layers made of tungsten for example are embedded in the grooves 13 and etched back.

The interlayer dielectric film 117 made of $SiO_2$ is formed by CVD. After the contact holes 117a to 117d are formed on the interlayer dielectric film 117, the plugs 118a to 118d are formed on the contact holes 117a to 117d. The power MOSFET 170 according to the second embodiment is formed in the aforementioned manner.

Third Embodiment

Figure 17:
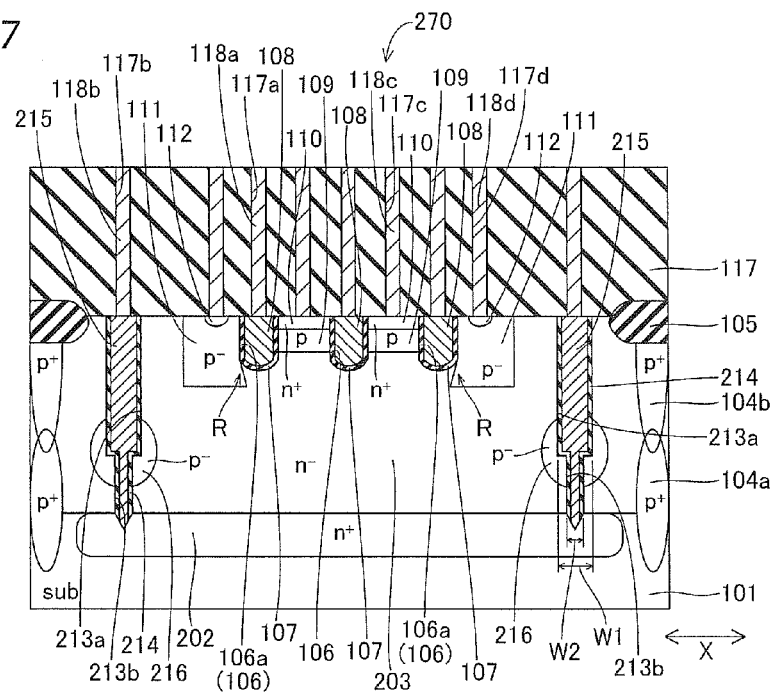
FIG. 17 is a sectional view showing a structure of a trench gate type power MOSFET according to a third embodiment of the present invention.

As shown in FIG. 17, impurity regions 216 are formed on prescribed regions in a power MOSFET 270 according to a third embodiment, dissimilarly to the aforementioned second embodiment.

In the power MOSFET 270, grooves 213a having widths W1 are formed on a surface of a drain drift region 203 as shown in FIG. 17. Grooves 213b having widths W2 smaller than the widths W1 are so formed on bottom surfaces of the grooves 213a as to reach a drain region 202. The widths W2 may be at most the widths W1.

Insulating films 214 made of $SiO_2$ are formed on side surfaces of the grooves 213a and 213b. Drawing portions 215 of the drain region 202, made of a conductive layer such as tungsten for example, are formed in the grooves 213a and 213b.

The $p^-$-type impurity regions 216 are formed on regions in the vicinity of interfaces between the grooves 213a and 213b in regions adjacent to the side surfaces of the grooves 213a and 213b. The impurity regions 216 are formed below lower ends of the grooves 106 at intervals from the drain region 202. The impurity regions 216 may be formed below impurity regions 111.

The remaining structure of the third embodiment is similar to that of the aforementioned second embodiment.

According to the third embodiment, as hereinabove described, the impurity regions 216 are formed, whereby a current path can be inhibited from being attracted to the lead-out portions 215.

Figure 18:
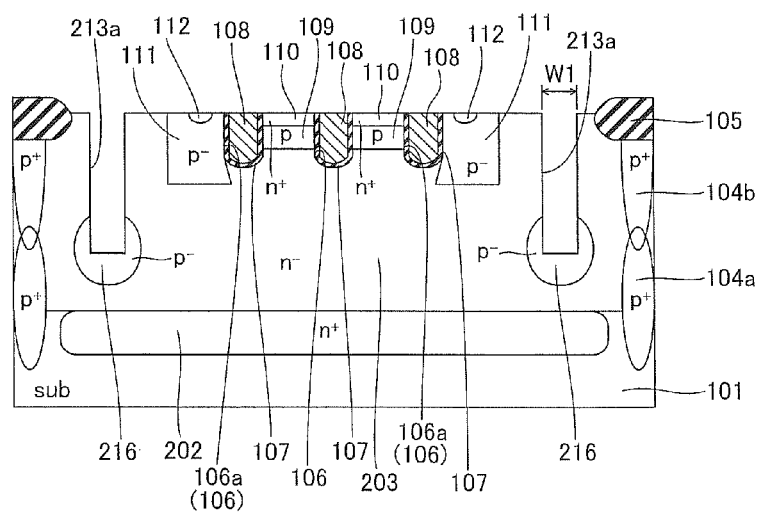
FIGS. 18 and 19 are sectional views for illustrating a fabricating process for the power MOSFET according to the third embodiment of the present invention.

In a fabricating process for the power MOSFET 270 according to the third embodiment of the present invention, a prescribed region on the surface of the drain drift region 203 is patterned by photolithography and etching, as shown in FIG. 18. Thus, the grooves 213a having the widths W1 are formed between the impurity regions 111 and element isolation portions 105. Thereafter the impurity regions 216 are formed in the vicinity of the bottom surfaces of the grooves 213a. More specifically, the p-type impurity is ion-implanted by employing resist masks in forming the grooves 213a, thereby forming the impurity regions 216. Thereafter the resist masks are removed. The steps up to that of forming impurity regions 112 are similar to those of the aforementioned second embodiment.

Figure 19:
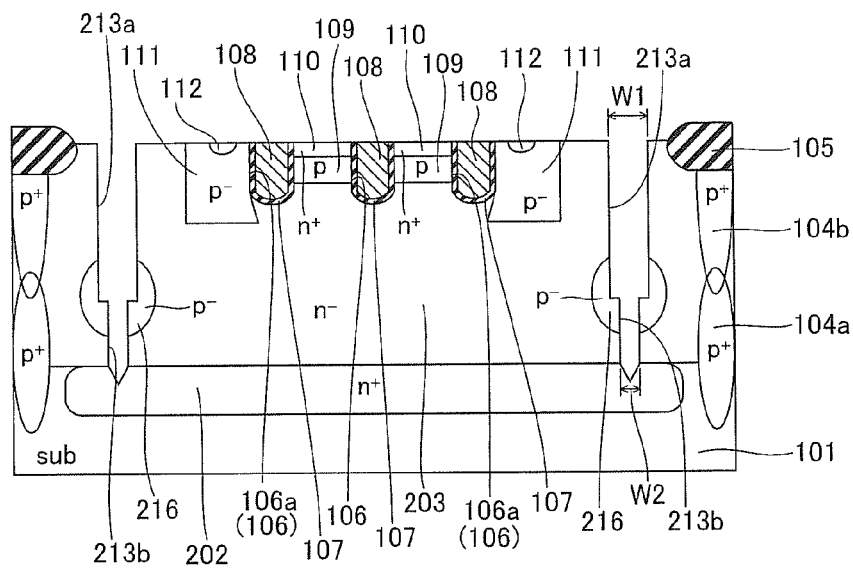

As shown in FIG. 19, the bottom surfaces of the grooves 213a are patterned by photolithography and etching. Thus, the grooves 213b are formed on the bottom surfaces of the grooves 213a. The grooves 213b are so formed as to have the widths W2 and reach the drain region 202. The grooves 213b having the widths W2 substantially identical with the widths W1 may be formed by employing the resist masks in forming the grooves 213a.

Thereafter the insulating films 214, the lead-out portions 215, an interlayer dielectric film 117 and plugs 118 are formed, similarly to the aforementioned second embodiment.

Fourth Embodiment

Figure 20:
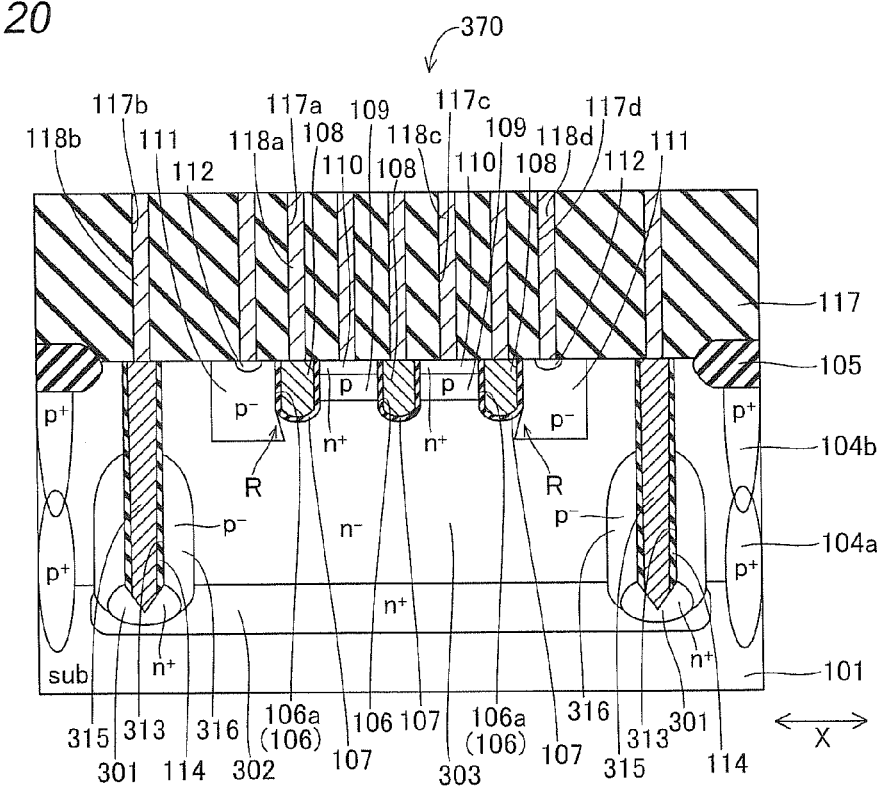
FIG. 20 is a sectional view showing a structure of a trench gate type power MOSFET according to a fourth embodiment of the present invention.

As shown in FIG. 20, impurity regions 316 are formed so as not to be exposed at a surface of a drain drift region 303 in a power MOSFET 370 according to a fourth embodiment, dissimilarly to the aforementioned second embodiment.

As shown in FIG. 20, the p⁻-type impurity regions 316 are formed on regions adjacent to side surfaces of grooves 313 in the power MOSFET 370. The impurity regions 316 are so formed below lower ends of the grooves 106 as to reach a drain region 302. N⁺-type impurity regions 301 for connecting lead-out portions 315 and the drain region 302 are formed between the grooves 313 and the drain region 302. The impurity regions 316 may be formed below regions corresponding to impurity regions 111.

The remaining structure of the fourth embodiment is similar to that of the aforementioned second embodiment.

According to the fourth embodiment, as hereinabove described, the impurity regions 316 are formed, whereby a current path can be inhibited from being attracted to the lead-out portions 315.

Figure 21:
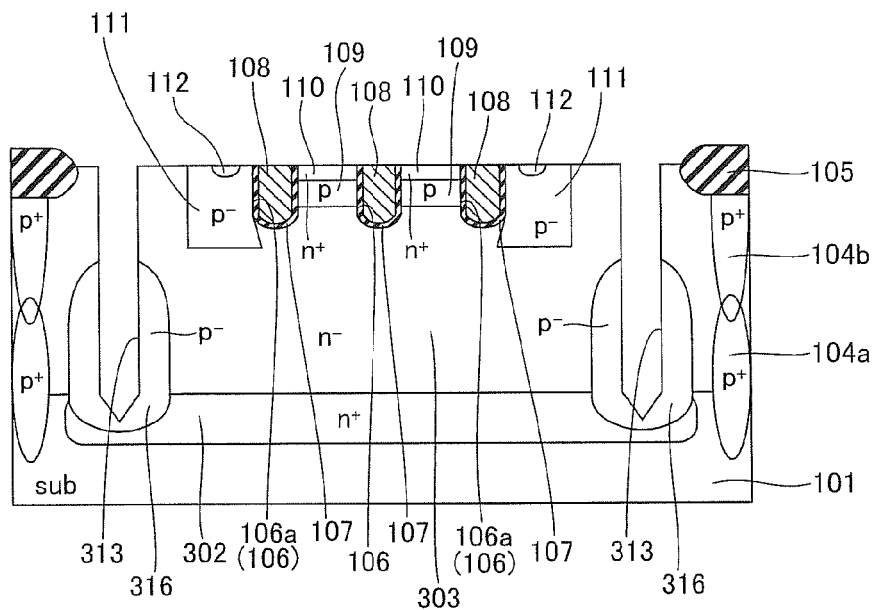
FIGS. 21 and 22 are sectional views for illustrating a fabricating process for the power MOSFET according to the fourth embodiment of the present invention.
Figure 22:
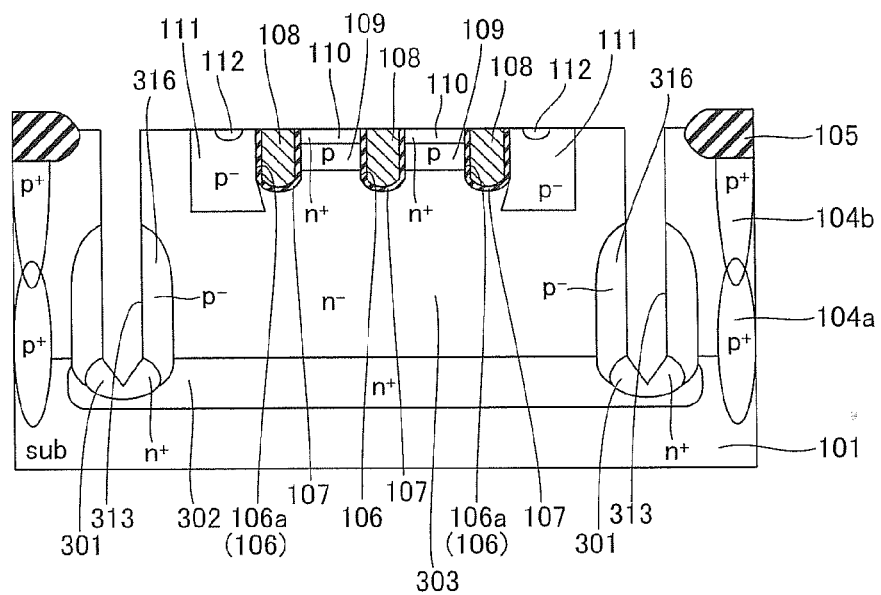

In a fabricating process for the power MOSFET 370 according to the fourth embodiment of the present invention, the impurity regions 316 are formed partially on the regions adjacent to the side surfaces of the grooves 313, as shown in FIG. 21. More specifically, resist masks in forming the grooves 313 are employed for ion-implanting the p-type impurity and dispersing the implanted impurity, thereby forming the impurity regions 316. Thereafter the impurity regions 301 are formed between the grooves 313 and the drain region 302 as shown in FIG. 22. More specifically, the n-type impurity is ion-implanted by employing the resist masks in forming the grooves 313, thereby forming the impurity regions 301. Thereafter the resist masks are removed. The steps up to that of forming impurity regions 313 are similar to those of the aforementioned second embodiment.

Thereafter insulating films 114, the lead-out portions 315, an interlayer dielectric film 117 and plugs 118 are formed similarly to the aforementioned second embodiment.

Although the present invention has been described and illustrated in detail, it is clearly understood that the same is by way of illustration and example only and is not to be taken by way of limitation, the spirit and scope of the present invention being limited only by the terms of the appended claims.

For example, while the impurity region 11 and the lead-out portions 15 are provided at the prescribed intervals (L1, for example) in each of the aforementioned first to fourth embodiments, the present invention is not restricted to this but the impurity region and the lead-out portions may be provided adjacent to each other through insulating films.

While the impurity region 11 (111) projects toward the outermost grooves (6a) below the outermost grooves (6a) among the plurality of grooves 6 (106) in each of the aforementioned first to fourth embodiments, the present invention is not restricted to this but the impurity region may not project toward the grooves below the grooves.

While three grooves 6 (106) are formed in each of the aforementioned first to fourth embodiments, the present invention is not restricted to this but four or more grooves may be formed.

While only one group including the plurality of gate electrodes, the base regions, the source regions, the impurity region (11, 111) and the lead-out portions is formed in each of the aforementioned first to fourth embodiments, the present invention is not restricted to this but a plurality of groups each including the plurality of gate electrodes, the base regions, the source regions, the impurity region and the lead-out portions may be formed.

While a ground voltage is applied to the source regions and the impurity region (11, 111) in each of the aforementioned first to fourth embodiments, the present invention is not restricted to this but a voltage other than the ground voltage may be applied to the source regions and the impurity region.

While a voltage is not applied to the impurity regions 116 (216, 316) in each of the aforementioned second to fourth embodiments, the present invention is not restricted to this but a prescribed voltage (ground voltage, for example) may be applied to the impurity regions 116 (216, 316).

What is claimed is:

1. A semiconductor device comprising:
   a first conductive type first drain region;
   a first conductive type second drain region formed on said first drain region and having an impurity concentration lower than an impurity concentration of said first drain region;
   a lead-out portion of said first drain region formed so as to reach said first drain region through said second drain region;
   a second conductive type base region formed on said second drain region;
   a first conductive type source region formed on said base region;
   a gate electrode formed through an insulating film in a groove having a first side surface adjacent to said source region and said base region; and
   a second conductive type first impurity region formed adjacent to a second side surface of said groove between said groove and said lead-out portion so as to extend downward beyond a lower end of said groove, wherein
   said first impurity region has an impurity concentration lower than an impurity concentration of said base region.

2. The semiconductor device according to claim 1, wherein said first impurity region is formed in an annular shape so as to surround said gate electrode, said base region and said source region in plan view, and
   said lead-out portion is provided outside said annular first impurity region in plan view.

3. The semiconductor device according to claim 1, wherein said first impurity region is formed so as to project toward said groove below said groove.

4. The semiconductor device according to claim 1, wherein said first impurity region and said lead-out portion are arranged at a prescribed interval.

5. The semiconductor device according to claim 1, wherein a prescribed voltage is applied to said first impurity region.

6. The semiconductor device according to claim 5, further comprising:
- a plug for applying said prescribed voltage to said first impurity region; and
- a second conductive type second impurity region provided for connecting said first impurity region and said plug, having an impurity concentration higher than an impurity concentration of said first impurity region.

7. The semiconductor device according to claim 5, wherein the same voltage as said prescribed voltage applied to said first impurity region is applied to said source region.

8. The semiconductor device according to claim 1, wherein said first impurity region is formed so as to extend downward beyond a lower end of said base region formed between said grooves.

9. A semiconductor device comprising:
- a first conductive type first drain region;
- a first conductive type second drain region formed on said first drain region and having an impurity concentration lower than an impurity concentration of said first drain region;
- a lead-out portion of said first drain region formed so as to reach said first drain region through said second drain region;
- a gate electrode formed in a groove formed on said second drain region;
- a second conductive type impurity region for current path control formed adjacent to said lead-out portion downward beyond at least a lower end of said groove; and
- a second conductive type first impurity region formed between said groove and said impurity region for current path control and formed separately from said impurity region for current path control, so as to extend downward beyond said lower end of said groove.

10. The semiconductor device according to claim 9, wherein
said impurity region for current path control is formed so as to reach said first drain region.

11. The semiconductor device according to claim 9, wherein
said impurity region for current path control is formed so as to reach a surface of said second drain region.

12. The semiconductor device according to claim 9, wherein said first impurity region is formed so as to project toward said groove below said groove.

13. A method of fabricating a semiconductor device, comprising steps of:
- forming a first conductive type first drain region;
- forming a first conductive type second drain region having an impurity concentration lower than an impurity concentration of said first drain region on said first drain region;
- forming a lead-out portion of said first drain region so as to reach said first drain region through said second drain region;
- forming a groove on said second drain region;
- forming a gate electrode in said groove;
- forming a second conductive type impurity region for current path control adjacent to said lead-out portion downward beyond at least a lower end of said groove by ion-implanting an impurity; and
- forming a second conductive type first impurity region between said groove and said impurity region for current path control, separately from said impurity region for current path control, so as to extend downward beyond said lower end of said groove by ion-implanting an impurity.

14. The method of fabricating a semiconductor device according to claim 13, wherein
said step of forming said impurity region for current path control includes a step of forming said impurity region for current path control so as to reach said first drain region.

* * * * *